United States Patent
Fujiwara et al.

(10) Patent No.: US 6,607,594 B2
(45) Date of Patent: Aug. 19, 2003

(54) METHOD FOR PRODUCING SILICON SINGLE CRYSTAL

(75) Inventors: Hideki Fujiwara, Saga-ken (JP); Manabu Nishimoto, Saga-ken (JP); Isamu Miyamoto, Osaka (JP); Hiroshi Morita, Saga-ken (JP)

(73) Assignee: Sumitomo Metal Industries, Ltd. (JP)

( * ) Notice: Subject to any disclaimer, the term of this patent is extended or adjusted under 35 U.S.C. 154(b) by 0 days.

(21) Appl. No.: 10/020,574

(22) Filed: Dec. 18, 2001

(65) Prior Publication Data

US 2002/0129759 A1 Sep. 19, 2002

(30) Foreign Application Priority Data

Dec. 20, 2000 (JP) .................. 2000-386860

(51) Int. Cl.⁷ .............................. C30B 15/00
(52) U.S. Cl. ............................ 117/32
(58) Field of Search ................ 117/13, 14, 15, 117/32

(56) References Cited

U.S. PATENT DOCUMENTS

| | | | | |
|---|---|---|---|---|
| 5,359,959 A | * | 11/1994 | Fusegawa et al. | 117/13 |
| 5,725,661 A | * | 3/1998 | Fusegawa et al. | 117/202 |
| 5,911,822 A | * | 6/1999 | Abe et al. | 117/13 |
| 5,911,823 A | * | 6/1999 | Sonoda et al. | 117/30 |
| 5,925,185 A | * | 7/1999 | Kawashima et al. | 117/13 |
| 6,348,095 B1 | * | 2/2002 | Watanabe et al. | 117/13 |

FOREIGN PATENT DOCUMENTS

JP 411209197 A * 8/1999 .......... C30B/29/06

OTHER PUBLICATIONS

Collected Lecture Thesisses of Japan Machinery Institute No. 11 Calculated Dynamics Meeting (1998), No. 166, pp. 419 and 420.
"Barauku Kessho Seicho Gijutsu" (Bulk Crystal Growth Technolg) (Baifukan), pp. 141 to 143.

* cited by examiner

Primary Examiner—Benjamin L. Utech
Assistant Examiner—Matthew A. Anderson
(74) Attorney, Agent, or Firm—Lorusso, Loud & Kelly

(57) ABSTRACT

A method for producing a silicon single crystal, the method being capable of suppressing the dislocation of a single crystal. When a silicon single crystal is produced by a Czochralski method in which a horizontal magnetic field or a cusp magnetic field is applied and the single crystal during growth is dislocated, the single crystal with dislocations is dissolved in a nonmagnetic field condition and thereafter a magnetic field is applied again to pull up the silicon single crystal. The flow rate of argon gas is designed to be 100 L/min or more and the pressure in a furnace is designed to be 6700 pa or less when the single crystal with dislocations is dissolved.

4 Claims, 3 Drawing Sheets

METHOD FOR PRODUCING SILICON SINGLE CRYSTAL

CROSS-REFERENCE TO RELATED APPLICATION

This application claims, under 35 USC 119, priority of Japanese Application Number 2000-386860 filed Dec. 20, 2000.

BACKGROUND OF THE INVENTION

1. Field of the Invention

The present invention relates to a method for producing a silicon single crystal, and more particularly, to a method for producing a silicon single crystal, the method capable of suppressing a dislocation of a silicon single crystal.

2. Description of the Related Art

There are many methods for producing a silicon single crystal. A typical one among these methods is a Czochralski method (CZ method). FIG. 3 is a typical sectional view showing a single crystal producing apparatus used in the CZ method. In the figure, the reference numeral 1 represents a crucible disposed in a chamber. The crucible 1 is constituted of an internal layer support container 1a made of quartz and having a bottomed cylindrical form and an external support container 1b made of graphite and having the same bottomed cylindrical form, the external support container being fitted so as to support the outside of the internal layer support container 1a. The crucible 1 is secured to the top end of a support shaft 6 which can be rotated and can rise and fall.

A resistance heating type heater 2 is disposed concentrically on the external side of the crucible 1. A melt 13 prepared by melting a fixed amount of raw material by a heater 2 is filled in the crucible 1. A pulling shaft 5 constituted of a wire or a shaft which rotates at a specific speed in a reverse direction or the same direction on the same axis as the support shaft 6 above the center axis of the crucible 1. A seed crystal 15 is allowed to hang from the pulling shaft 5.

When a silicon single crystal is produced using such a single crystal producing apparatus according to the CZ method, first a raw material of silicon is placed in the crucible 1 and the internal pressure in the apparatus is decreased under an inert gas atmosphere. Thereafter, the raw material of silicon is melted by the heater 2 disposed around the crucible 1. After that, the seed crystal 15 hanging from the pulling shaft 5 is immersed in the melt 13 and the pulling shaft 5 is pulled up while rotating the crucible 1 and the pulling shaft 5 to grow a silicon single crystal 12 at the bottom end of the seed crystal 15.

In this CZ method, first a necking portion 12a-forming step of contracting the diameter of the seed crystal 15 up to about 3 mm is performed to remove dislocations involved originally in the seed crystal 15 and dislocations introduced by thermal shock when the seed crystal 15 is dipped in the melt and then a body portion 12c having a fixed diameter is formed through a shoulder portion 12b-forming step of increasing the diameter gradually up to a given crystal diameter.

In the meantime, in the production of a silicon single crystal by the CZ method, a quartz crucible is primarily used as the crucible 1a for storing the silicon melt 13 as aforementioned. When this quartz crucible 1a is brought into contact with the silicon melt 13, its surface is melted to emit oxygen into the melt 13. Oxygen contained in the melt 13 is partly incorporated into the single crystal 12 during pulling-up and has various adverse effects on the quality of a silicon wafer. It is therefore necessary to control the quantity of oxygen to be incorporated into the single crystal 12.

There is, for example, a magnetic-field-applied CZ method as a method of controlling the concentration of oxygen. This method is called a MCZ method (Magnetic-field-applied CZ), in which a magnetic field is applied to the melt, whereby the convection of the melt perpendicular to the line of magnetic force can be limited and controlled. There are various methods as this method of applying a magnetic field and particularly a HMCZ method (Horizontal MCZ) in which a magnetic field is applied in a horizontal direction and a CMCZ method (Cusp MCZ) in which two coils surrounding the furnace body of an apparatus are installed with currents flowing through these coils in the directions opposite to each other to apply a cusp magnetic field are put in practical use.

SUMMARY OF THE INVENTION

The foregoing MCZ method has characteristics superior in oxygen density-controllability to those of the CZ method. However, like the CZ method, SiO evaporated from the surface of the silicon melt is cooled and solidified. The solidified SiO falls on the surface of the melt and is incorporated in to the single crystal. Also, the inside wall of the quartz crucible which is in contact with the melt is crystallized and the crystallized portion is peeled off during the growth of the single crystal and incorporated into the single crystal. As aforementioned, these disturbance factors can be avoided incompletely in the MCZ method and a dislocation of the single crystal is frequently caused during the course of the production of the silicon single crystal.

For this reason, when a dislocation of the single crystal is produced in the relatively earlier stage of the production of the silicon single crystal, the single crystal with dislocations is immersed once in the melt and dissolved by controlling the temperature of the melt. Then, the necking step is again started to produce a silicon single crystal newly. It is clear that this production method is desirable in view of productivity.

However, if a silicon single crystal is again produced by dissolving the single crystal with dislocations when this MCZ method is applied to the production of a silicon single crystal having a diameter as large as 200 mm or more by using a large diameter crucible having a diameter of 500 mm or more, this poses the problem that a dislocation of the single crystal occurs frequently in the step of forming the shoulder portion of the single crystal, which significantly decreases the yield of the crystal.

This invention has been made in view of the above situation and it is an object of the present invention to provide a method for producing a silicon single crystal, the method capable of suppressing the dislocation of a single crystal and improving the yield of the silicon single crystal in a MCZ method even if the single crystal with dislocations is dissolved to produce the silicon single crystal again.

A method for producing a silicon single crystal according to the present invention comprises producing a silicon single crystal by a Czochralski method in which a magnetic field is applied, wherein in the case where dislocations are generated in the single crystal during growth, the single crystal with dislocations is dissolved in a nonmagnetic field condition and thereafter a magnetic field is applied again to pull up the silicon single crystal.

In the method for producing a silicon single crystal according to the present invention, the flow rate of argon gas to be supplied to a single crystal producing apparatus is designed to be 100 L/min or more and the pressure in the single crystal producing apparatus is designed to be 6700 pa or less when the dislocated single crystal is dissolved. Further, the number of rotations of the crucible is designed to be 3 rpm or more.

The reason why in the case where the single crystal with dislocations is redissolved while a magnetic field is applied to the melt in the crucible, the dislocation of the single crystal frequently occurs in the subsequent shoulder portion-forming step is considered as follows.

The flow of the melt in the crucible has been clarified by numerical analysis in recent years. For example, in "Collected Lecture Thesisses of Japan Machinery Institute No. 11 Calculated Dynamics Meeting, (1998), No. 166, pages 419 and 420, the fact is shown that the flow of the melt in the crucible is a roll-like flow running counter to the center plane parallel to the direction of an applied magnetic field in the HMCZ method and an axisymmetric flow rectified in the peripheral direction is present in the CMCZ method. These flows are all directed to the center of the crucible from the wall of the crucible.

Because the temperature of the melt must be raised to dissolve the single crystal with dislocations in general, the evaporation of SiO from the surface of the melt and the dissolution of the inside wall of the quartz crucible which is in contact with the melt are promoted. For this reason, it is considered that in the case of dissolving the single crystal with dislocations in such a condition that a magnetic field is applied to the melt, foreign substances contained in the melt exist as it is in the vicinity of the surface of the melt for a long time, so that they are carried on the flow running towards the center of the crucible from the wall of the crucible and easily reach the growth boundary of the single crystal, causing frequent dislocations.

On the other hand, in "BARUKU KESSHO SEICHO GIJUTSU (Bulk Crystal Growth Technology) (Baifukan), page 141 to page 143", the fact is shown that in a usual CZ method in which no magnetic field is applied, the flow of the melt in the crucible is a flow having a non-axisymmetric eddy structure. Such a flow is considered to render it difficult for the aforementioned foreign substances in the melt to reach the growth surface of the single crystal.

Specifically, if the single crystal with dislocations is dissolved in such a condition that no magnetic field is applied to the melt in the crucible, the condition of the melt which rejects the access of foreign substances on the surface of the melt to the center of the crucible is created. The dislocation of the single crystal can be prevented by pulling the silicon single crystal under the application of a magnetic field in this condition of the melt.

Also, when the single crystal with dislocations is dissolved, it is desirable that the flow rate of argon gas to be supplied to the single crystal producing apparatus be designed to be 100 L/min or more and the pressure in the apparatus be designed to be 6700 pa or less. This accelerates the flow rate of argon gas flowing over the surface of the melt, so that SiO evaporated from the surface of the melt can be efficiently discharged to the outside of the apparatus efficiently and foreign substances floating on the surface of the melt can be driven towards the wall of the crucible.

Moreover, when the single crystal with dislocations is dissolved, the number of rotations of the crucible is desirably 3 rpm or more. By rotating the crucible at a relatively high rotation speed, foreign substances floating on the surface of the melt can be driven towards the wall of the crucible and stuck to the inside wall of the quartz crucible.

BRIEF DESCRIPTION OF THE DRAWINGS

In the accompanying drawings, there are shown illustrative embodiments of the invention from which these other of its objectives, novel features, and advantages will be readily apparent.

In the drawings.

DESCRIPTION OF THE PREFERRED EMBODIMENTS

An embodiment of the present invention will be hereinafter explained with reference to the drawings.

Figure 1:
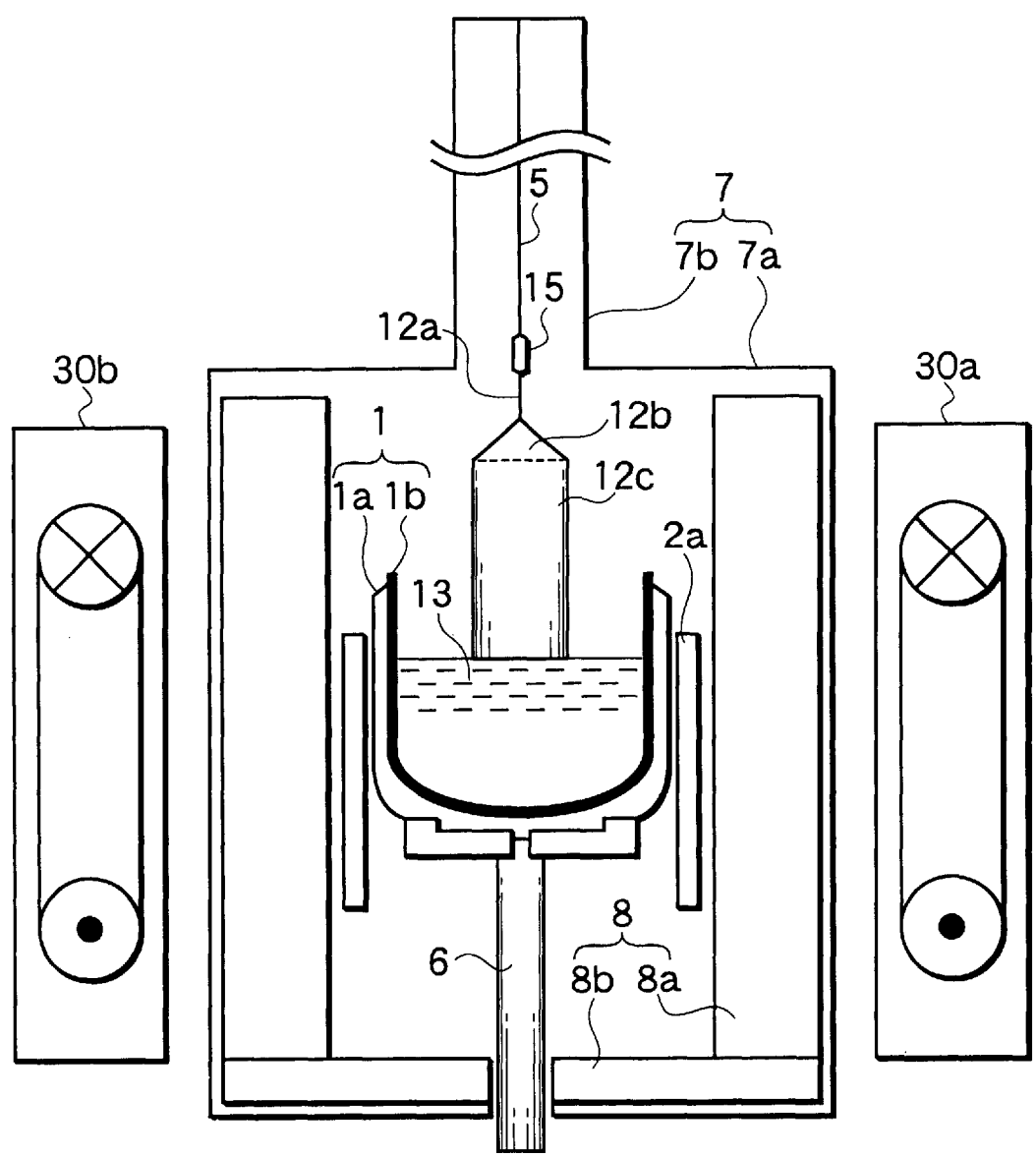
FIG. 1 is a sectional view typically showing an apparatus for producing a single crystal, the apparatus being used to practice a method for producing a silicon single crystal according to the present invention.

FIG. 1 is a schematic sectional view of an apparatus for producing a single crystal, the apparatus being used to practice a method for producing a silicon single crystal according to the present invention. In the figure, the reference numeral 7 represents a cylindrical chamber. The chamber 7 is constituted of a main chamber 7a having a cylindrical form and a cylindrical pull-chamber 7b secured directly to the main chamber 7a. A heater 2 is arranged on the outside of the crucible 1, a heat insulating cylinder 8a is arranged concentrically on the outside of the heater 2 and a heat insulating board 8b is arranged on the bottom of the main chamber 7a.

A raw material is filled in the crucible 1 and melted by the heater 2. A pulling shaft 5 which can be rotated on the same axis as a support shaft 6 and is movable vertically is formed such that it is hung through the pull-chamber 7b on the center axis of the crucible 1. A seed crystal 15 is fitted to the bottom end of the pulling shaft 5. Paired superconductive magnets 30a and 30b are arranged opposite to each other on the outside of the main chamber 7a to form a horizontal magnetic field.

Next, the case of producing a silicon single crystal having a diameter of 200 mm as a product by using this apparatus for producing a single crystal will be explained in detail.

First, 130 kg of silicon raw material is filled in a quartz crucible 1a having a diameter of 22 inches and a p-type dopant, boron is added to the raw material such that the electric resistance in a single crystal is about 10 Ω/cm. After that, the pressure in the main chamber 7a is decreased to 6700 pa and 100 L/min of argon gas as inert gas is introduced into the main chamber 7a. The raw material and the dopant in the quartz crucible 1a are dissolved using the heater 2 to form a melt 13 in the quartz crucible 1a.

A horizontal magnetic field having an intensity of 0.4 teslas is applied to the melt 13 in the quartz crucible 1a and the seed crystal 15 fitted to the bottom end of the pulling shaft 5 is allowed to be wetted in the melt 13. In this condition, the pulling shaft 5 is pulled up while rotating the pulling shaft 5 and the crucible 1 in reverse directions. Thereafter, a silicon single crystal 12 is grown at the bottom end of the seed crystal 15 through a prescribed step of forming a necking portion 12a, step of forming a shoulder portion 12b and step of forming a body portion 12c.

Here, the number of rotations of the crucible 1 is designed to be 1 rpm in the step of forming the necking portion 12a and is then controlled afterwards such that it is increased one after another and it is finally set to a constant rotation of 5 rpm in the step of forming the body portion 12c. The number of rotations of the pulling shaft 5 is set to a constant rotation of 10 rpm through all steps.

Forty (40) batches of pulling test using the above method of producing a silicon single crystal were carried out and as a result, a dislocation of a single crystal occurred in the step of forming the shoulder portion 12b of the single crystal or in the step of forming the body portion 12c in seven (7) batches. In all of these seven (7) batches, the dislocation of the single crystal occurred in the relatively earlier stage. Therefore, with regard to the above seven (7) batches, each single crystal with dislocations was immersed in the melt 13 and dissolved by raising the output of the heater 2 to try reproducing a silicon single crystal in the same conditions as in the aforementioned production of the single crystal.

In order to confirm how the condition of the occurrence of the dislocation of the single crystal changed afterwards depending on whether or not a horizontal magnetic field was applied when the single crystal with dislocations was dissolved, these single crystals with dislocations were dissolved partly in the condition that a horizontal magnetic field remained applied to the melt and partly in the condition that no horizontal magnetic field was applied to the melt. In both cases, the flow rate and pressure of argon gas to be supplied to the chamber when the single crystal was dissolved were 130 L/mm and 4000 pa respectively and the number of rotations of the crucible was 5 rpm. The results of the pulled-up samples at this time are shown in Table 1.

TABLE 1

| Batch No. | | Number of pulling | Position where dislocations were generated |
|---|---|---|---|
| Conventional examples | A | 1 | Body portion 220 mm |
| | | 2 | Shoulder portion φ200 mm |
| | | 3 | Shoulder portion φ110 mm |
| | B | 1 | Shoulder portion φ270 mm |
| | | 2 | Shoulder portion φ85 mm |
| | | 3 | Shoulder portion φ140 mm |
| | | 4 | Shoulder portion φ110 mm |
| | C | 1 | Body portion 50 mm |
| | | 2 | Shoulder portion φ140 mm |
| | D | 1 | Shoulder portion φ240 mm |
| | | 2 | Shoulder portion φ160 mm |
| | | 3 | Shoulder portion φ120 mm |
| | | 4 | Shoulder portion φ80 mm |
| Examples of the present invention | E | 1 | Shoulder portion φ120 mm |
| | | 2 | No dislocation in all regions |
| | F | 1 | Body portion 160 mm |
| | | 2 | No dislocation in all regions |
| | G | 1 | Shoulder portion φ85mm |
| | | 2 | Tail |

In Table 1, the conventional examples A to D show the results when the single crystal with dislocations was dissolved in the condition that a horizontal magnetic field remained applied and the examples E and F of the present invention show the results when the single crystal with dislocations was dissolved in the condition that no with dislocation show the was applied to the melt.

As is clear from Table 1, it is found that in the case of the conventional examples A to D, a dislocation of the single crystal occurs in the step of forming the shoulder portion or in step of forming the body portion in the pulling of the single crystal after and including the second pulling of the single crystal obtained by dissolving the single crystal with dislocations in the first pulling in the condition of the melt to which a horizontal magnetic field is applied. Also, even if this single crystal with dislocations was redissolved in the condition that a horizontal magnetic field was applied to carry out pulling of the single crystal plural times, the same results were obtained. On the contrary, it is found that in the examples E and F of the present invention, no dislocation of the single crystal occurs.

Figure 2:
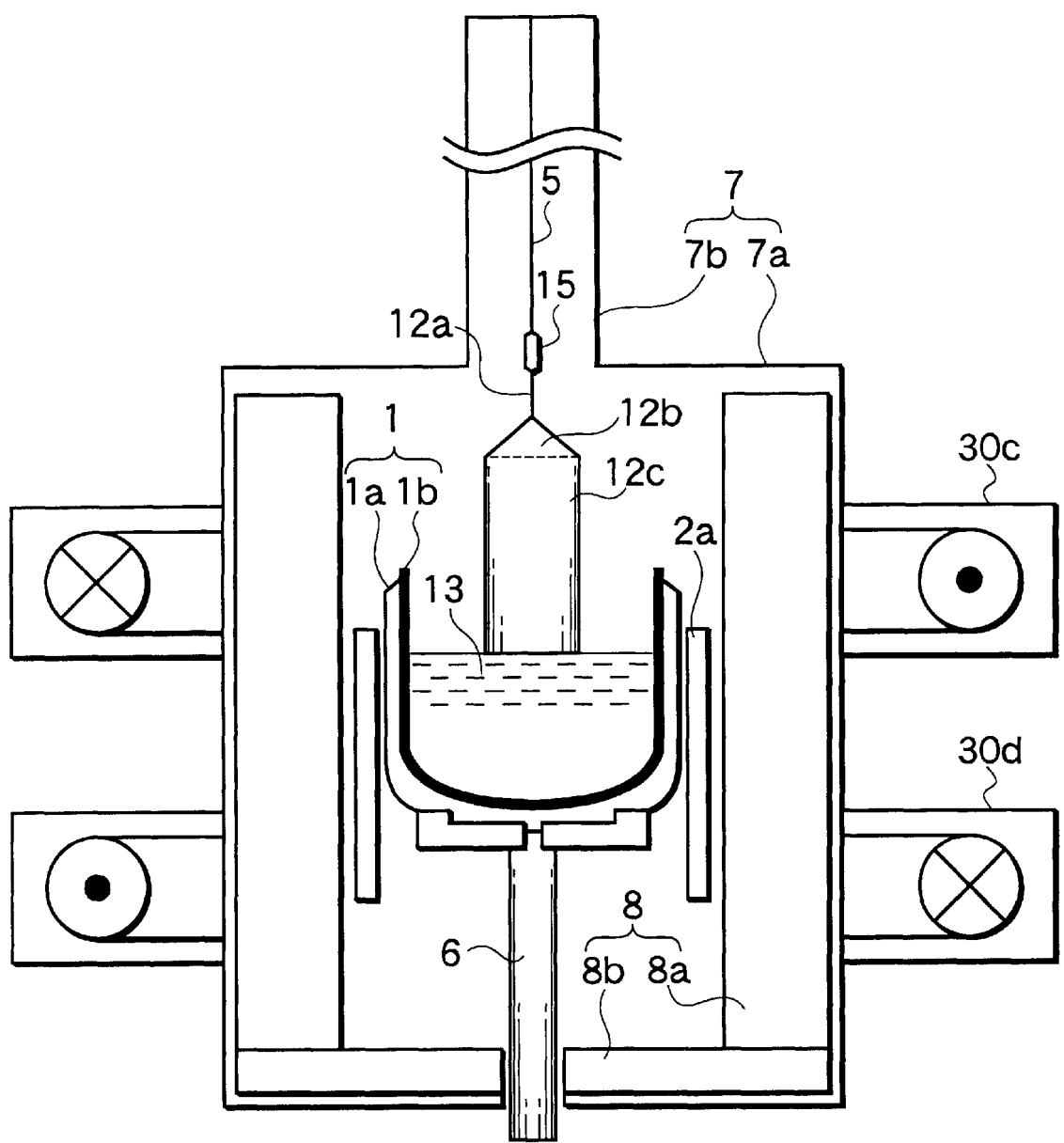
FIG. 2 is a sectional view typically showing an apparatus for producing a single crystal, the apparatus being used in a CMCZ method according to an embodiment of the present invention.
Figure 3:
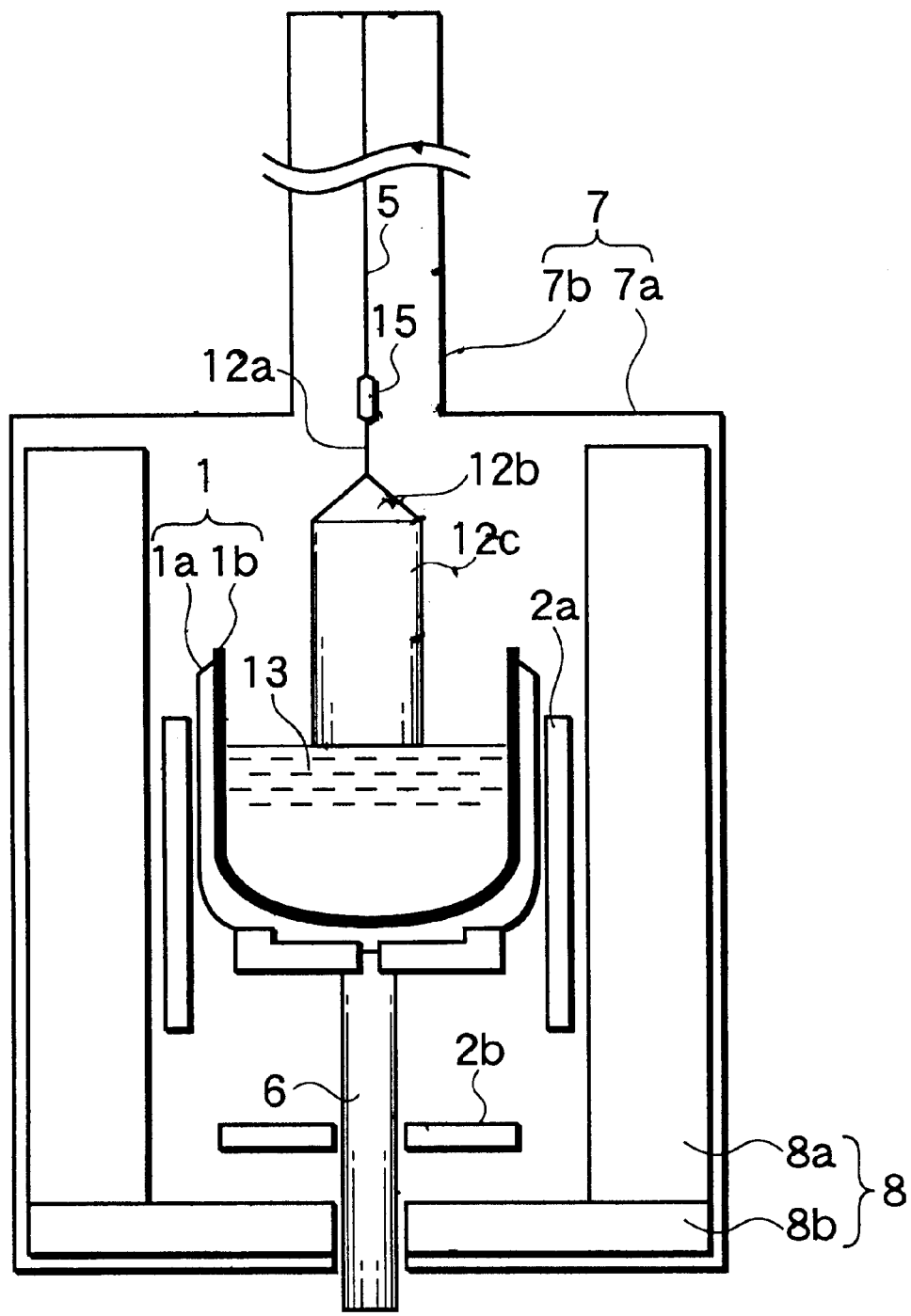
FIG. 3 is a sectional view typically showing an apparatus for producing a single crystal, the apparatus being used in a CZ method.

Also, a method for producing a silicon single crystal by applying a cusp magnetic field to a melt will be explained as another embodiment of the present invention. The structure of an apparatus used in this method is the same as that of the aforementioned single crystal producing apparatus using a horizontal magnetic field except for the structure in which, as shown in FIG. 2, superconductive magnets 30c and 30d are disposed in such a manner as to surround the outside of the main chamber 7a and a cusp magnetic field is applied to the melt with currents flowing through these magnets 30c and 30d being reversed. Detailed explanations will be furnished as to a method for producing a silicon single crystal having a diameter of 200 mm as a product by using this single crystal producing apparatus.

In the same manner as the production of a silicon single crystal by applying a horizontal magnetic field, first 130 kg of silicon raw material is filled in a 22-inch-diameter quartz crucible 1a and a p-type dopant, boron is added to the raw material such that the electric resistance in a single crystal is about 10 Ω/cm. After that, the pressure in the main chamber 7a is decreased to 6700 pa and 100 L/min of argon gas as inert gas is introduced into the main chamber 7a. The raw material and the dopant in the quartz crucible 1a are dissolved using the heater 2 to form a melt 13 in the quartz crucible 1a.

Next, a cusp magnetic field having an intensity of 0.08 teslas is applied to the melt 13 in the quartz crucible 1a and the seed crystal 15 fitted to the bottom end of the pulling shaft 5 is allowed to be wetted in the melt 13. In this condition, the pulling shaft 5 is pulled up while rotating the pulling shaft 5 and the crucible 1 in reverse directions. Thereafter, a silicon single crystal 12 is grown at the bottom end of the seed crystal 15 through a prescribed step of forming a necking portion 12a, step of forming a shoulder portion 12b and step of forming a body portion 12c.

Here, the number of rotations of the crucible 1 is designed to be 12 rpm in the step of forming the necking portion 12a and is then controlled afterwards such that it is decreased one after another and it is finally set to a constant rotation of 6 rpm in the step of forming the body portion 12c. The number of rotations of the pulling shaft 5 is set to a constant rotation of 10 rpm through all steps.

Forty (40) batches of pulling test using the above method of producing a silicon single crystal were carried out and as a result, a dislocation of a single crystal occurred in the step of forming the shoulder portion 12b of the single crystal or in the step of forming the body portion 12c in eight (8) batches. In all of these eight (8) batches, the dislocation of the single crystal occurred in the relatively earlier stage. Therefore, with regard to the above eight (8) batches, each single crystal with dislocations was immersed in the melt 13 and dissolved by raising the output of the heater 2 to try reproducing a silicon single crystal in the same conditions as in the aforementioned production of the single crystal.

In order to confirm how the condition of the occurrence of the dislocation of the single crystal changed afterwards depending on whether or not a cusp magnetic field was applied when the single crystal with dislocations was dissolved, these single crystals with dislocations were dissolved partly in the condition that a cusp magnetic field remained applied to the melt and partly in the condition that no cusp magnetic field was applied to the melt. In both cases, the flow rate and pressure of argon gas to be supplied to the chamber when the single crystal was dissolved were 120 L/mm and 4000 pa respectively and the number of rotations of the crucible was also 3 rpm. The results of the pulled-up samples at this time are shown in Table 2.

TABLE 2

| Batch No. | | Number of pulling | Position where dislocations were generated |
| --- | --- | --- | --- |
| Conventional examples | H | 1 | Body portion 260 mm |
| | | 2 | Shoulder portion φ80 mm |
| | | 3 | Body portion 280 mm |
| | I | 1 | Shoulder portion φ160 mm |
| | | 2 | Shoulder portion φ160 mm |
| | | 3 | Body portion 160 mm |
| | J | 1 | Shoulder portion φ110 mm |
| | | 2 | Body portion 160 mm |
| | K | 1 | Body portion 210 mm |
| | | 2 | Shoulder portion φ260 mm |
| | | 3 | Shoulder portion φ220 mm |
| Examples of the present invention | L | 1 | Shoulder portion φ50 mm |
| | | 2 | Shoulder portion φ40 mm |
| | | 3 | Shoulder portion φ70 mm |
| | | 4 | Shoulder portion φ50 mm |
| | M | 1 | Body portion 70 mm |
| | | 2 | No dislocation in all regions |
| | N | 1 | Body portion 160 mm |
| | | 2 | No dislocation in all regions |
| | O | 1 | Shoulder portion φ140 mm |
| | | 2 | Body portion 910 mm |

Table 2, the conventional examples H to L show the results when the single crystal with dislocations was redissolved in the condition that a cusp magnetic field was applied and the examples M to O of the present invention show the results when the single crystal with dislocations was dissolved in the condition that no cusp magnetic field was applied to the melt. In both cases, the flow rate and pressure of argon gas to be supplied to the chamber when the single crystal was dissolved were 130 L/mm and 4000 pa respectively and the number of rotations of the crucible was 5 rpm.

As is clear from Table 2, it is found that in the case of the conventional examples H to L, a dislocation of the single crystal occurs in the step of forming the shoulder portion or in the step of forming the body portion in the pulling of the single crystal after and including the second pulling of the single crystal obtained by dissolving the single crystal dislocated in the first pulling in the condition of the melt to which a cusp magnetic field is applied. Also, even if this single crystal with dislocations was redissolved in the condition that a cusp magnetic field was applied to carry out pulling of the single crystal plural times, the same results were obtained. On the contrary, it is found that in the examples M to O of the present invention, no dislocation of the single crystal occurs.

According to the method for producing a silicon single crystal of the present invention, a single crystal with dislocations is dissolved in the condition that no magnetic field is applied to a melt in a crucible, whereby incorporation of foreign substance floating on the surface of the melt into the single crystal is limited when the single crystal is pulled up afterwards and a dislocation in a shoulder portion-forming step can be suppressed, thereby achieving a remarkable improvement in the yield.

This invention being thus described, it will be obvious that the same may be varied in various ways. Such variations are not to be regarded as departure from the spirit and scope of the invention, and all such modifications would be obvious for one skilled in the art intended to be included within the scope of the following claims.

What is claimed is:

1. A method for producing a silicon single crystal by a Czochralski method in which a magnetic field is applied, wherein in the case where dislocations are generated in the single crystal during growth, the single crystal with dislocations is dissolved without application of a magnetic field and thereafter a magnetic field is again applied while pulling the silicon single crystal.

2. A method for producing a silicon single crystal according to claim 1, wherein the single crystal is pulled from a melt in a crucible and wherein the crucible is rotated at 3 rpm or more when the single crystal with dislocations is dissolved.

3. A method for producing a silicon single crystal according to claim 1, using a single crystal producing apparatus wherein argon gas is supplied to the single crystal producing apparatus at a flow rate of 100 L/min or more and the pressure in the single crystal producing apparatus is 6700 pa or less when the single crystal with dislocations is dissolved.

4. A method for producing a silicon single crystal according to claim 3, wherein the single crystal is pulled from a melt in a crucible is and wherein the crucible is rotated at 3 rpm or more when the single crystal with dislocations is dissolved.

* * * * *

UNITED STATES PATENT AND TRADEMARK OFFICE
CERTIFICATE OF CORRECTION

PATENT NO. : 6,607,594 B2
DATED : August 19, 2003
INVENTOR(S) : Fujiwara et al.

It is certified that error appears in the above-identified patent and that said Letters Patent is hereby corrected as shown below:

Column 8,
Line 45, "crucible is and" should read -- crucible and --.

Signed and Sealed this

Sixteenth Day of March, 2004

JON W. DUDAS
*Acting Director of the United States Patent and Trademark Office*